US011157112B2

(12) United States Patent
Tian et al.

(10) Patent No.: US 11,157,112 B2
(45) Date of Patent: Oct. 26, 2021

(54) DISPLAY PANEL, DISPLAY DEVICE AND MANUFACTURING METHOD OF DISPLAY PANEL

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Pengcheng Tian, Beijing (CN); Zhengxin Zhang, Beijing (CN); Xin Li, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/502,407

(22) Filed: Jul. 3, 2019

(65) Prior Publication Data
US 2020/0012363 A1    Jan. 9, 2020

(30) Foreign Application Priority Data
Jul. 6, 2018 (CN) .......................... 201810739650.6

(51) Int. Cl.
*G06F 3/042* (2006.01)
*H01L 27/12* (2006.01)
(Continued)

(52) U.S. Cl.
CPC ............ *G06F 3/042* (2013.01); *H01L 27/124* (2013.01); *H01L 27/1259* (2013.01);
(Continued)

(58) Field of Classification Search
CPC ....... H01L 27/12–1255; H01L 27/1259–1296; H01L 2021/775; H01L 27/32–3274;
(Continued)

(56) References Cited

U.S. PATENT DOCUMENTS

| 7,787,082 B2 * | 8/2010 | Ito ....................... H01L 31/0216 349/116 |
| 2009/0321640 A1 * | 12/2009 | Onogi .................. G01J 1/1626 250/338.1 |

(Continued)

*Primary Examiner* — Jonathan Han
(74) *Attorney, Agent, or Firm* — Brooks Kushman P.C.

(57) ABSTRACT

The present disclosure provides a display panel, a display device and manufacturing method of the display panel. The display panel includes a display area and a peripheral area located at a periphery of the display area, a light transmittance region is provided in the peripheral region; at least one first sub-pixels is provided at positions corresponding to the light transmittance regions, wherein at least one of the first sub-pixels is provided with a first thin film transistor, the first thin film transistor is connected with the first gate line, the first data line, and the first pixel electrode, wherein the first gate line is floating; a first pixel electrode is disposed in at least one of the first sub-pixels; and at least one first sensing electrode has an orthogonal projection on a base substrate partially overlapped with an orthogonal projection of the at least one first sub-pixel.

12 Claims, 1 Drawing Sheet

(51) Int. Cl.
*H01L 31/0232* (2014.01)
*H01L 31/113* (2006.01)
*H01L 31/14* (2006.01)

(52) U.S. Cl.
CPC .... *H01L 31/02325* (2013.01); *H01L 31/1136* (2013.01); *H01L 31/145* (2013.01)

(58) Field of Classification Search
CPC ............... H01L 27/3248; H01L 27/124; H01L 31/02325; H01L 31/1136; H01L 31/145; G06F 3/042; G06F 3/0412; G06F 3/044; G06F 2203/04103
See application file for complete search history.

(56) References Cited

U.S. PATENT DOCUMENTS

2011/0148835 A1* 6/2011 Yamazaki ............ G09G 3/3648
345/207
2011/0316427 A1* 12/2011 Okajima ............. H01L 31/1804
315/151
2016/0026045 A1* 1/2016 Inamura ............ G02F 1/136204
349/12
2017/0288001 A1* 10/2017 Ito ....................... H01L 27/3272

* cited by examiner

DISPLAY PANEL, DISPLAY DEVICE AND MANUFACTURING METHOD OF DISPLAY PANEL

CROSS-REFERENCE TO RELATED APPLICATION

This application claims priority to Chinese Patent Application No. 201810739650.6 filed on Jul. 6, 2018, which is incorporated herein by reference in its entirety.

TECHNICAL FIELD

The present disclosure relates to the field of display technologies, and in particular to a display panel, a display device, and a manufacturing method of the display panel.

BACKGROUND

Current electronic products such as mobile terminals are equipped with light sensors to sense external light changes, thereby automatically controlling the brightness of the screen or turning on/off the screen. In traditional electronic products, the light sensor is independent of the display screen, and additional specialized components need to be purchased to be integrated into the products, which increases the cost and assembly steps of the whole product. At present, an integration requirement of the electronic products is increasing, and the integration requirement of the display screen which is the main component is higher.

SUMMARY

The present disclosure provides a display panel including a display area and a peripheral area located at a periphery of the display area, a light transmittance region is provided in the peripheral region;

at least one first sub-pixels is provided at positions corresponding to the light transmittance regions, wherein at least one of the first sub-pixels is provided with a first thin film transistor, the first thin film transistor is connected with the first gate line, the first data line, and the first pixel electrode, wherein the first gate line is floating;

a first pixel electrode is disposed in at least one of the first sub-pixels; and at least one first sensing electrode has an orthogonal projection on a base substrate partially overlapped with an orthogonal projection of the at least one first sub-pixel.

Optionally, the first data line is connected to a driving IC through a first signal line, and the first sensing electrode is connected to the driving IC through a second signal line.

Optionally, a plurality of second sub-pixels arranged in an array is provided at the display area, wherein each of the second sub-pixels is connected to a second gate line and a second data line;

a second pixel electrode and a second thin film transistor are disposed in each of the second sub-pixels, and the second thin film transistor is connected with the second gate line, the second data line, and the second pixel electrode, the first data line and the second data line are separated from each other, and the second gate line and the second data line are both connected to the driving IC;

a plurality of common electrodes are disposed at the display area, each of the common electrodes is disposed corresponding to one of the second sub-pixels, and each of the common electrodes is connected with the driving IC through a third signal line.

Optionally, the first gate line and the second gate line are formed in a same layer and with the same material;

the first data line and the second data line are formed in a same layer and with the same material;

the source, the drain and the gate of the first thin film transistor are respectively formed in a same layer and with the same material as the source, the drain and the gate of the second thin film transistor;

the first pixel electrode is formed in a same layer and with the same material as the second pixel electrode;

the first sensing electrode is formed in a same layer and with the same material as the common electrode; and the first signal line, the second signal line, and the third signal line are formed in a same layer and with the same material.

Optionally, each of the first sensing electrodes is disposed corresponding to at least two of the first sub-pixels, and the first data lines for the at least two first sub-pixels are connected to a same first signal line.

Optionally, the second substrate is a color filter substrate, the color film substrate is provided with a light shielding layer, wherein an orthogonal projection of the light shielding layer on a base substrate does not overlap with the light shielding layer.

The present disclosure also provides a display device including the above display panel.

Optionally, the display device further includes a first polarizer disposed on a side of the first substrate of the display panel away from the second substrate, and a second polarizer disposed on a side of the second substrate of the display panel away from the first substrate, wherein the second polarizer does not cover the light transmittance region.

The present disclosure also provides a manufacturing method for manufacturing the above display panel, the method including:

forming a second substrate, wherein a light transmittance region is provided in the peripheral region of the second substrate, a light shielding layer at the light transmittance region is removed such that light is incident on the first substrate through the second substrate;

forming a first substrate, wherein a plurality of first sub-pixels is provided at positions corresponding to the light transmittance regions on the first substrate, wherein each of the first sub-pixels is connected to a first gate line and a first data line, a first pixel electrode and a first thin film transistor are disposed in each of the first sub-pixels, the first thin film transistor is connected with the first gate line, the first data line, and the first pixel electrode, wherein the first gate line is floating, and the first data line is connected to a driving IC through a first signal line; and forming a plurality of first sensing electrodes on the first substrate or the second substrate, wherein each of the first sensing electrodes is disposed corresponding to at least one of the first sub-pixels and is connected to the driving IC through a second signal line.

Optionally, the manufacturing method further includes:

forming, in the display area, a plurality of second sub-pixels arranged in an array, wherein each of the second sub-pixels is connected to a second gate line and a second data line, a second pixel electrode and a second thin film transistor are disposed in each of the second sub-pixels, and the second thin film transistor is connected with the second gate line, the second data line, and the second pixel electrode, the first data line and the second data line are separated from each other, and the second gate line and the second data line are both connected to the driving IC; and forming a plurality of common electrodes on the first substrate or the second substrate, each of the common electrodes is disposed corresponding to one of the second sub-pixels, and each of the common electrodes is connected with the driving IC through a third signal line.

Optionally, in the manufacturing method, the first gate line and the second gate line are formed by a same patterning process;

the first data line and the second data line are formed by a same patterning process;

the source and drain of the first thin film transistor and the source and drain of the second thin film transistor are formed by a same patterning process;

a gate of the first thin film transistor and a gate of the second thin film transistor are formed by a same patterning process;

the first pixel electrode and the second pixel electrode are formed by a same patterning process;

the first sensing electrode and the common electrode are formed by a same patterning process; and the first signal line, the second signal line, and the third signal line are formed by a same patterning process.

DETAILED DESCRIPTION

The technical solutions of the embodiments of the present disclosure will be clearly and completely described below in conjunction with the drawings of the embodiments of the present disclosure. It is apparent that the described embodiments are part of the embodiments of the present disclosure, and not all of the embodiments. All other embodiments obtained by those of ordinary skill in the art based on the described embodiments of the present disclosure are within the scope of the disclosure.

In the related art, the light sensor is separately disposed external to the display screen, and the integration of the display screen is lowered. The embodiments of the present disclosure provide a display panel, a display device, and a manufacturing method of display panel which integrate light sensors in the display panel, thereby an integration degree can be increased.

Figure 1:
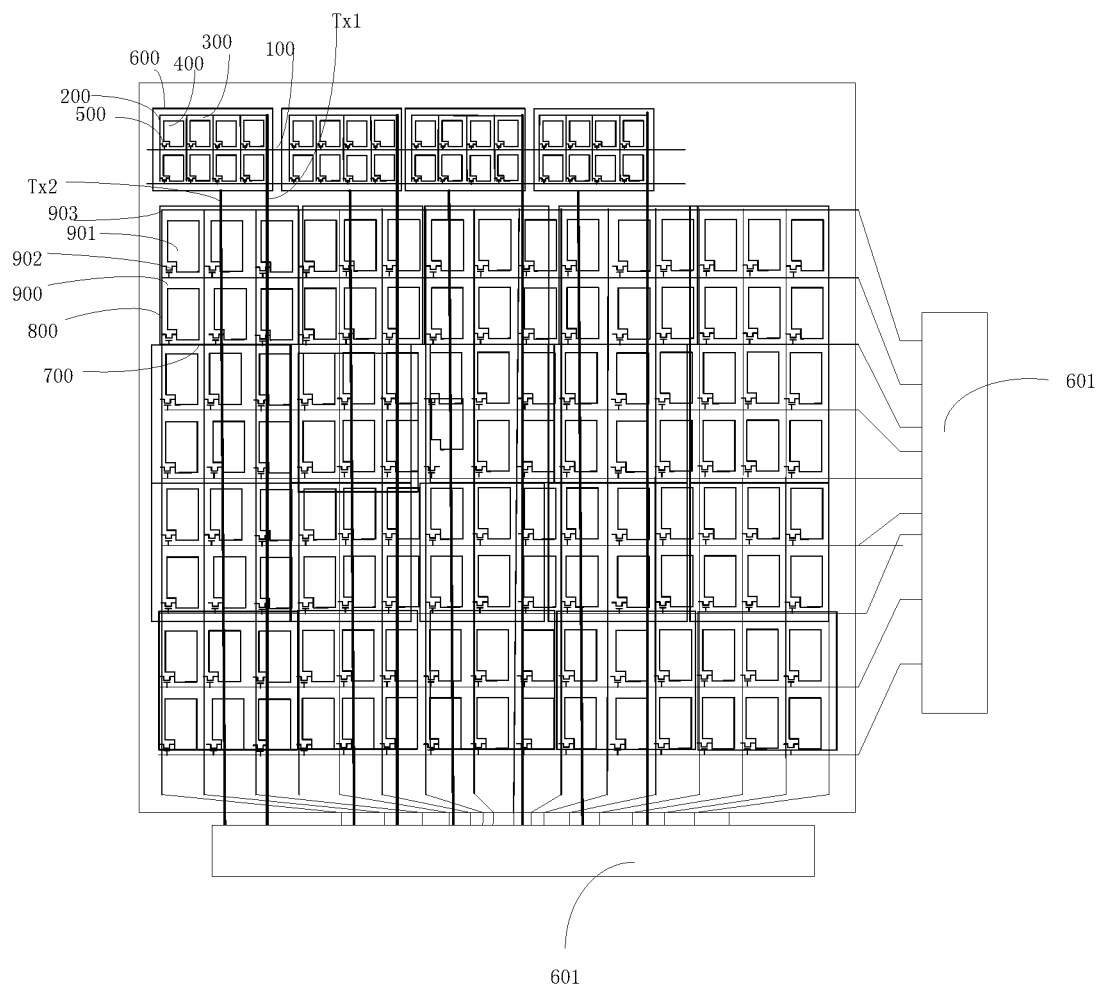
FIG. 1 is a schematic structural diagram of a display panel according to some embodiments of the present disclosure.
Figure 2:
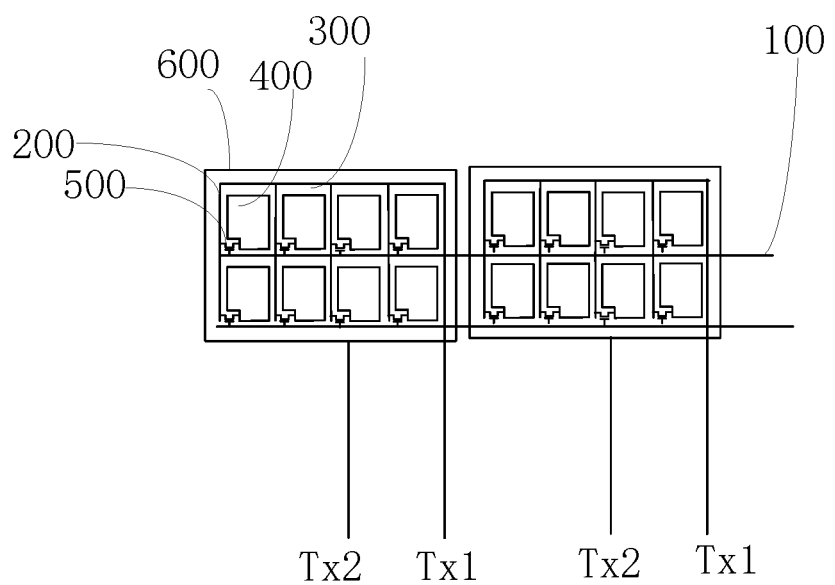
FIG. 2 is a partially enlarged schematic diagram showing a first gate line, a first data line, a first pixel electrode, a first sensing electrode, and a first thin film transistor disposed at a light transmitting region of the display panel according to some embodiments of the present disclosure.

As shown in FIGS. 1 and 2, the present disclosure provides a display panel including a first substrate and a second substrate which are oppositely arranged, wherein the display panel has a display area and a peripheral area located at a periphery of the display area, a light transmittance region is provided in the peripheral region of the second substrate, wherein a light shielding layer at the light transmittance region is removed such that light is incident on the first substrate through the second substrate;

a plurality of first sub-pixels 300 is provided at positions corresponding to the light transmittance regions on the first substrate, wherein each of the first sub-pixels 300 is connected to a first gate line 100 and a first data line 200;

a first pixel electrode 400 and a first thin film transistor 500 are disposed in each of the first sub-pixels, the first thin film transistor 500 is connected with the first gate line 100, the first data line 200, and the first pixel electrode 400, wherein the first gate line 100 is floating, the first data line 200 is connected to a driving IC 601 through a first signal line Tx1;

a plurality of first sensing electrodes 600 insulated from each other are further disposed on the first substrate or the second substrate, and each of the first sensing electrodes 600 is disposed corresponding to at least one of the first sub-pixels 300; and the first sensing electrodes 600 are connected to the driving IC 601 through a second signal line Tx2.

According to some embodiments of the present disclosure, by providing a light transmittance region at a peripheral area of the second substrate, light is incident on the first substrate through the light transmittance region on the second substrate. A first data line 200, a first gate line 100, a first sub-pixel 300, a first thin film transistor 500, and a first sensing electrode 600 are disposed on the first substrate at a position corresponding to the light transmittance region, wherein the first gate line 100 is floating, the first data line 200 and the first sensing electrode 600 are respectively connected to the driving IC 601 of the display panel through two signal lines. Since the first gate line 100 is not supplied with signal, that is, the first gate line 100 is in a floating state, when light is irradiated onto the first thin film transistor 500 without any shielding, the first gate line 100 is switched on, thereby causing leakage current. And a Differ value of the leakage current is increased, such that capacitance value of the first sensing electrode 600 is changed. In this way, the first data line 200, the first gate line 100, the first sub-pixel 300, the first thin film transistor 500, and the first sensing electrode 600 form a light sensor, and the light sensor is integrated on the display panel. Moreover, when the Differ value exceeds a certain threshold voltage, it can be judged that there is illumination, and based on the magnitude of the Differ value, the intensity of the illumination can be further determined, thereby the screen brightness of the display panel or other related function of the product can be adjusted accordingly.

It should be appreciated that, the common electrode and the second signal lines in the above embodiments can be disposed on the first substrate or on the second substrate. Optionally, in some embodiments of the present disclosure, the common electrode, the first signal lines and the second signal lines are disposed on the first substrate.

In the embodiment as shown in the drawings, a plurality of second sub-pixels 900 arranged in array are provided in the display area, and a plurality of second gate lines 700 and a plurality of second data lines 800 are arranged in the display area in a crossed manner.

Each of the second sub-pixels 900 is connected to a second gate line 700 and a second data line 800. A second pixel electrode 901 and a second thin film transistor 902 are disposed in each of the second sub-pixels 900, and the second thin film transistor 902 is connected with the second gate line 700, the second data line 800, and the second pixel electrode 901, the first data line 200 and the second data line 800 are separated from each other, and the second gate line 700 and the second data line 800 are both connected to the driving IC 601.

A plurality of common electrodes 903 are disposed on the first substrate or the second substrate, each of the common electrodes 903 is disposed corresponding to one of the second sub-pixels 900, and each of the common electrodes 903 is connected with the driving IC 601 through a third signal line.

In some embodiments, the display panel provided by the present disclosure is a TDDI display panel, that is, a touch and display driver integration display panel. In such solutions the common electrode 903 is multiplexed, so that the time sharing multiplexing technique can be utilized. For example, during a display period, the driving IC 601 applies a display driving signal to the common electrode 903 and the second pixel electrode 901 such that the common electrode 903 and the second pixel electrode 901 interact with each other to form a multi-dimensional electric field, the display function can be realized. And in the touch time period, the driving IC 601 applies a touch signal to the common electrode 903, thereby the common electrode 903 can be used as a sensing electrode to form the mutual inductance capacitor, and the touch function can be realized.

It should be understood that, in practical applications, the display panel may be other types of display panels, for example, non-touch display panels.

In addition, in the above solution, the first data line 200 and the second data line 800 are separated from each other, and the first data line 200 is connected to the driving IC 601 through the first signal line Tx1, so that the driving IC 601 does not need to apply a display driving signal (source signal) to the first data line 200; wherein the first gate line 100 is floating.

Furthermore, in some embodiments of the present disclosure, the first gate line 100 and the second gate line 700 are formed in a same layer and with the same material; the first data line 200 and the second data line 800 are formed in a same layer and with the same material; the source, the drain and the gate of the first thin film transistor 500 are respectively formed in a same layer and with the same material as the source, the drain and the gate of the second thin film transistor 902; the first pixel electrode 400 is formed in a same layer and with the same material as the second pixel electrode 901; the first sensing electrode 600 is formed in a same layer and with the same material as the common electrode 903; and the first signal line Tx1, the second signal line Tx2, and the third signal line are formed in a same layer and with the same material.

In some embodiments of the present disclosure, when the second gate line 700 is formed on the display area of the first substrate, the first gate line 100 is formed in the peripheral region of the first substrate by using a same patterning process; while forming the second data line 800, the first data line 200 is formed in a peripheral region of the first substrate by using a same patterning process; while forming the film layers of the second thin film transistor 902 at the display area of the first substrate, the film layers of the first thin film transistor 500 is formed in a peripheral region of the first substrate; when the common electrode 903 is formed in a display region of the first substrate, the first sensing electrode 600 is formed by using the same patterning process; when the third signal line is formed on the first substrate, the first signal line Tx1 and the second signal line Tx2 are formed by the same patterning process. In this way, integration of the light sensor on the display panel can be realized on the basis of the existing TDDI display panel process and the overall design structure without adding further process.

As shown in the drawings, in some embodiments of the present disclosure, each of the first sensing electrodes 600 is disposed corresponding to at least two of the first sub-pixels 300, and the first data lines 200 for the at least two first sub-pixels 300 are connected to a same first signal line Tx1.

With the above solution, each one of the first sensing electrodes 600 is disposed corresponding to a plurality of first sub-pixels 300, and the first data lines 200 for connecting the first pixel electrodes 400 in the plurality of first sub-pixels 300 are connected to a same first signal line Tx1. In this way, the first data lines 200 for the plurality of first sub-pixels 300 corresponding to the first sensing electrodes 600 are supplied with same signals.

Moreover, in some embodiments of the present disclosure, the second substrate is a color filter substrate, the color film substrate is provided with a light shielding layer, wherein an orthogonal projection of the light shielding layer on a base substrate does not overlap with the light shielding layer.

According to the above solution, a light shielding layer (for example, a black matrix) is disposed on the conventional color film substrate in the peripheral region. In some embodiments, the hollow film may be hollowed out on the light shielding layer or the entire color film substrate may be grooved in the light transmittance region, such that the light shielding layer does not cover the light transmittance region.

According to some embodiments of the present disclosure, by providing a light transmittance region at a peripheral area of the second substrate, light is incident on the first substrate through the light transmittance region on the second substrate. A first data line, a first gate line, a first sub-pixel, a first thin film transistor and a first sensing electrode are disposed on the first substrate at a position corresponding to the light transmittance region, wherein the first gate line is floating, the first data line and the first sensing electrode are respectively connected to the driving IC of the display panel through two signal lines. Since the first gate line is not supplied with signal, that is, the first gate line is in a floating state, when light is irradiated onto the first thin film transistor without any shielding, the first gate line is switched on, thereby causing leakage current. And a Differ value of the leakage current is increased, such that capacitance value of the first sensing electrode is changed. In this way, the first data line, the first gate line, the first sub-pixel, the first thin film transistor and the first sensing electrode form a light sensor, and the light sensor is integrated on the display panel.

The present disclosure also provides a display device including the above display panel.

In some embodiments of the present disclosure, the display device further includes a first polarizer disposed on a side of the first substrate of the display panel away from the second substrate, and a second polarizer disposed on a side of the second substrate of the display panel away from the first substrate, wherein the second polarizer does not cover the light transmittance region.

In some embodiments, the display panel is provided with a first polarizer and a second polarizer. In order to ensure the light passing through the transmittance region to be incident on the second substrate, the second polarizer on the first substrate can be hollowed out at the positions corresponding to the light transmittance region, or the size of the second polarizer can be reduced, such that the second polarizer does not cover the light transmittance region.

The present disclosure also provides a manufacturing method for manufacturing the display panel according to the above embodiments of the present disclosure, the method including:

forming a second substrate, wherein a light transmittance region is provided in the peripheral region of the second substrate, a light shielding layer at the light transmittance region is removed such that light is incident on the first substrate through the second substrate;

forming a first substrate, wherein a plurality of first sub-pixels 300 is provided at positions corresponding to the light transmittance regions on the first substrate, wherein each of the first sub-pixels 300 is connected to a first gate line 100 and a first data line 200, a first pixel electrode 400 and a first thin film transistor 500 are disposed in each of the first sub-pixels 300, the first thin film transistor 500 is connected with the first gate line 100, the first data line 200, and the first pixel electrode 400, wherein the first gate line 100 is floating, and the first data line 200 is connected to a driving IC 601 through a first signal line Tx1; and forming a plurality of first sensing electrodes 600 on the first substrate or the second substrate, wherein each of the first sensing electrodes 600 is disposed corresponding to at least one of the first sub-pixels 300 and is connected to the driving IC 601 through a second signal line Tx2.

According to some embodiments of the present disclosure, by providing a light transmittance region at a peripheral area of the second substrate, light is incident on the first substrate through the light transmittance region on the second substrate. A first data line 200, a first gate line 100, a first sub-pixel 300, a first thin film transistor 500, and a first sensing electrode 600 are disposed on the first substrate at a position corresponding to the light transmittance region, wherein the first gate line 100 is floating, the first data line 200 and the first sensing electrode 600 are respectively connected to the driving IC 601 of the display panel through two signal lines. Since the first gate line 100 is not supplied with signal, that is, the first gate line 100 is in a floating state, when light is irradiated onto the first thin film transistor 500 without any shielding, the first gate line 100 is switched on, thereby causing leakage current. And a Differ value of the leakage current is increased, such that capacitance value of the first sensing electrode 600 is changed. In this way, the first data line 200, the first gate line 100, the first sub-pixel 300, the first thin film transistor 500, and the first sensing electrode 600 form a light sensor, and the light sensor is integrated on the display panel. Moreover, when the Differ value exceeds a certain threshold voltage, it can be judged that there is illumination on the light transmittance regions, and based on the magnitude of the Differ value, the intensity of the illumination can be further determined, thereby the screen brightness of the display panel or other related function of the product can be adjusted accordingly.

Note that in the above solutions, the manufacturing order of the first and second substrates is not particularly limited hereto.

In some embodiments, the manufacturing method further includes:

forming, in the display area of the first substrate, a plurality of second sub-pixels 900 arranged in an array, wherein each of the second sub-pixels 900 is connected to a second gate line 700 and a second data line 800, a second pixel electrode 901 and a second thin film transistor 902 are disposed in each of the second sub-pixels 900, and the second thin film transistor 902 is connected with the second gate line 700, the second data line 800, and the second pixel electrode 901, the first data line 200 and the second data line 800 are separated from each other, and the second gate line 700 and the second data line 800 are both connected to the driving IC 601; and forming a plurality of common electrodes 903 on the first substrate or the second substrate, each of the common electrodes 903 is disposed corresponding to one of the second sub-pixels 900, and each of the common electrodes 903 is connected with the driving IC 601 through a third signal line.

In some embodiments, the display panel provided by the present disclosure is a TDDI display panel, that is, a touch and display driver integration display panel. In such solutions the common electrode 903 is multiplexed, so that the time sharing multiplexing technique can be utilized. For example, during a display period, the driving IC 601 applies a display driving signal to the common electrode 903 and the second pixel electrode 901 such that the common electrode 903 and the second pixel electrode 901 interact with each other to form a multi-dimensional electric field, the display function can be realized. And in the touch time period, the driving IC 601 applies a touch signal to the common electrode 903, thereby the common electrode 903 can be used as a sensing electrode to form the mutual inductance capacitor, and the touch function can be realized.

Furthermore, in the manufacturing method, the first gate line 100 and the second gate line 700 are formed by a same patterning process;

the first data line 200 and the second data line 800 are formed by a same patterning process;

the source and drain of the first thin film transistor 500 and the source and drain of the second thin film transistor 902 are formed by a same patterning process;

a gate of the first thin film transistor 500 and a gate of the second thin film transistor 902 are formed by a same patterning process;

the first pixel electrode 400 and the second pixel electrode 901 are formed by a same patterning process;

the first sensing electrode 600 and the common electrode 903 are formed by a same patterning process; and the first signal line Tx1, the second signal line Tx2, and the third signal line are formed by a same patterning process.

According to the present disclosure, when the second gate line 700 is formed on the display area of the first substrate, the first gate line 100 is formed in the peripheral region of the first substrate by using a same patterning process; while forming the second data line 800, the first data line 200 is formed in a peripheral region of the first substrate by using a same patterning process; while forming the film layers of the second thin film transistor 902 at the display area of the first substrate, the film layers of the first thin film transistor 500 is formed in a peripheral region of the first substrate; when the common electrode 903 is formed in a display region of the first substrate, the first sensing electrode 600 is formed by using the same patterning process; when the third signal line is formed on the first substrate, the first signal line Tx1 and the second signal line Tx2 are formed by the same patterning process. In this way, integration of the light sensor on the display panel can be realized on the basis of the existing TDDI display panel process and the overall design structure without adding further process.

The above embodiments are merely the exemplary embodiments for illustrating a principle of the present disclosure. It should be appreciated that, those skilled in the art may make various modifications and improvements without departing from the spirit and essence of the present disclosure, and these modifications and improvements may also fall into the scope of the present disclosure.

What is claimed is:

1. A display panel, comprising a display area and a peripheral area located at a periphery of the display area,
a light transmittance region is provided in the peripheral region;

at least one first sub-pixels is provided at positions corresponding to the light transmittance regions, wherein at least one of the first sub-pixels is provided with a first thin film transistor, the first thin film transistor is connected with the first gate line, the first data line, and the first pixel electrode, wherein the first gate line is floating;

a first pixel electrode is disposed in at least one of the first sub-pixels; and at least one first sensing electrode has an orthogonal projection on a base substrate partially overlapped with an orthogonal projection of the at least one first sub-pixel.

2. The display panel of claim 1, wherein the first data line is connected to a driving IC through a first signal line, and the first sensing electrode is connected to the driving IC through a second signal line.

3. The display panel of claim 1, wherein
a plurality of second sub-pixels arranged in an array is provided at the display area, wherein each of the second sub-pixels is connected to a second gate line and a second data line;

a second pixel electrode and a second thin film transistor are disposed in each of the second sub-pixels, and the second thin film transistor is connected with the second gate line, the second data line, and the second pixel electrode, the first data line and the second data line are separated from each other, and the second gate line and the second data line are both connected to the driving IC;

a plurality of common electrodes are disposed at the display area, each of the common electrodes is disposed corresponding to one of the second sub-pixels, and each of the common electrodes is connected with the driving IC through a third signal line.

4. The display panel of claim 1, wherein
the first gate line and the second gate line are formed in a same layer and with the same material;
the first data line and the second data line are formed in a same layer and with the same material;
the source, the drain and the gate of the first thin film transistor are respectively formed in a same layer and with the same material as the source, the drain and the gate of the second thin film transistor;
the first pixel electrode is formed in a same layer and with the same material as the second pixel electrode;
the first sensing electrode is formed in a same layer and with the same material as the common electrode; and
the first signal line, the second signal line, and the third signal line are formed in a same layer and with the same material.

5. The display panel of claim 1, wherein
each of the first sensing electrodes is disposed corresponding to at least two of the first sub-pixels, and the first data lines for the at least two first sub-pixels are connected to a same first signal line.

6. The display panel of claim 1, wherein
the second substrate is a color filter substrate, the color film substrate is provided with a light shielding layer, wherein an orthogonal projection of the light shielding layer on a base substrate does not overlap with the light shielding layer.

7. The display panel of claim 1, further comprising a first substrate and a second substrate which are oppositely arranged.

8. A display device comprising the display panel of claim 1.

9. The display device of claim 8, wherein the display panel comprises a first substrate and a second substrate which are oppositely arranged, the display device further comprising a first polarizer disposed on a side of the first substrate of the display panel away from the second substrate, and a second polarizer disposed on a side of the second substrate of the display panel away from the first substrate, wherein the second polarizer does not cover the light transmittance region.

10. A manufacturing method for manufacturing a display panel comprising a first substrate and a second substrate which are oppositely arranged, wherein the display panel has a display area and a peripheral area located at a periphery of the display area, the method comprising:

forming a second substrate, wherein a light transmittance region is provided in the peripheral region of the second substrate, a light shielding layer at the light transmittance region is removed such that light is incident on the first substrate through the second substrate;

forming a first substrate, wherein a plurality of first sub-pixels is provided at positions corresponding to the light transmittance regions on the first substrate, wherein each of the first sub-pixels is connected to a first gate line and a first data line, a first pixel electrode and a first thin film transistor are disposed in each of the first sub-pixels, the first thin film transistor is connected with the first gate line, the first data line, and the first pixel electrode, wherein the first gate line is floating, and the first data line is connected to a driving IC through a first signal line; and forming a plurality of first sensing electrodes on the first substrate or the second substrate, wherein each of the first sensing electrodes is disposed corresponding to at least one of the first sub-pixels and is connected to the driving IC through a second signal line.

11. The method of claim 10, further comprising:
forming, in the display area, a plurality of second sub-pixels arranged in an array, wherein each of the second sub-pixels is connected to a second gate line and a second data line, a second pixel electrode and a second thin film transistor are disposed in each of the second sub-pixels, and the second thin film transistor is connected with the second gate line, the second data line, and the second pixel electrode, the first data line and the second data line are separated from each other, and the second gate line and the second data line are both connected to the driving IC; and forming a plurality of common electrodes on the first substrate or the second substrate, each of the common electrodes is disposed corresponding to one of the second sub-pixels, and each of the common electrodes is connected with the driving IC through a third signal line.

12. The method of claim 11, wherein
the first gate line and the second gate line are formed by a same patterning process;
the first data line and the second data line are formed by a same patterning process;
the source and drain of the first thin film transistor and the source and drain of the second thin film transistor are formed by a same patterning process;
a gate of the first thin film transistor and a gate of the second thin film transistor are formed by a same patterning process;
the first pixel electrode and the second pixel electrode are formed by a same patterning process;

the first sensing electrode and the common electrode are formed by a same patterning process; and the first signal line, the second signal line, and the third signal line are formed by a same patterning process.

\* \* \* \* \*